United States Patent [19]

Hara

[11] Patent Number: 5,442,314
[45] Date of Patent: Aug. 15, 1995

[54] CMOS CIRCUIT FOR GENERATING VOLTAGE RELATED TO TRANSISTOR GATE LENGTH

[75] Inventor: Takaaki Hara, Tokyo, Japan

[73] Assignee: NEC Corporation, Tokyo, Japan

[21] Appl. No.: 149,743

[22] Filed: Nov. 10, 1993

Related U.S. Application Data

[63] Continuation-in-part of Ser. No. 979,222, Nov. 20, 1992, abandoned.

[30] Foreign Application Priority Data

Nov. 22, 1991 [JP] Japan .................................. 3-332737

[51] Int. Cl.$^6$ ............................................. H03K 17/04
[52] U.S. Cl. ................................. 327/543; 327/537;
327/538; 327/546; 327/102
[58] Field of Search ................... 307/296.1, 519, 516,
307/296.6, 296.8; 365/189.06, 189.11; 327/543,
537, 546, 538, 102

[56] References Cited

U.S. PATENT DOCUMENTS

| | | | |
|---|---|---|---|
| 4,823,060 | 4/1989 | Doemen | 307/519 |
| 4,961,007 | 10/1990 | Kumanoya et al. | 307/296.8 |
| 5,039,893 | 8/1991 | Tomisawa | 307/594 |
| 5,041,739 | 8/1991 | Goto | 307/296.6 |

*Primary Examiner*—Timothy P. Callahan
*Assistant Examiner*—Terry L. Englund
*Attorney, Agent, or Firm*—Sughrue, Mion, Zinn, Macpeak & Seas

[57] ABSTRACT

The CMOS integrated circuit includes an oscillator including a capacitor having a polysilicon gate of one of several transistors as an electrode thereof and a diffused resistor located adjacent to the polysilicon gate, a counter circuit for calculating a frequency of the oscillator, a power-supply voltage control circuit for selecting an optimal power-supply voltage for transistors in accordance with the frequency, and a power-supply circuit for generating the optimal power-supply voltage.

3 Claims, 7 Drawing Sheets

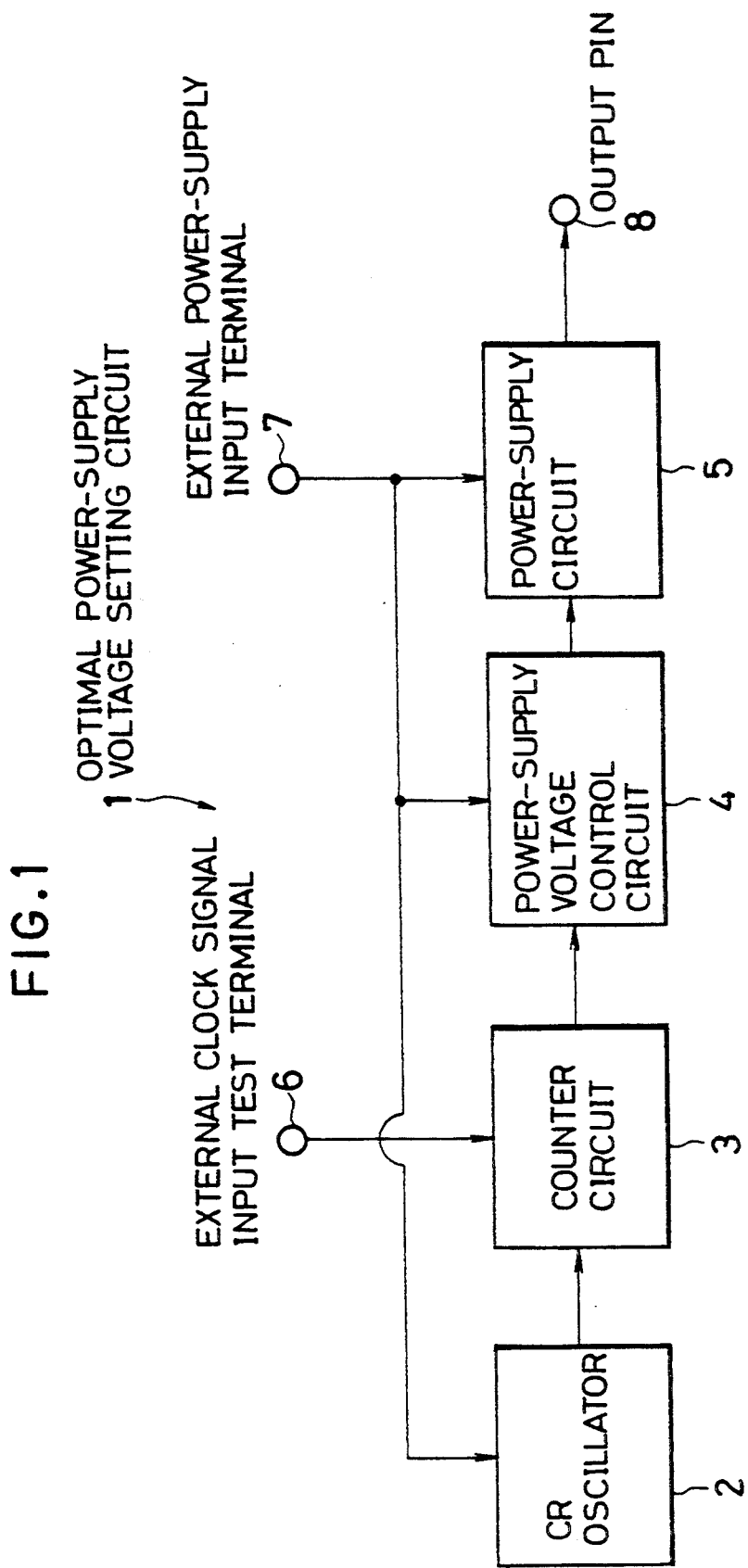

CMOS CIRCUIT FOR GENERATING VOLTAGE RELATED TO TRANSISTOR GATE LENGTH

This is a Continuation-in-Part of application Ser. No. 07/979,222, filed Nov. 20, 1992 now abandoned.

FIELD OF THE INVENTION

The invention relates to a CMOS integrated circuit device with a built-in power supply, and in particular to a CMOS integrated circuit device with a built-in circuit for setting, based on a length of a transistor gate, an optimal voltage which a power-supply voltage circuit can supply, the optimum voltage being the voltage at which the transistor can operation at its highest speed without consuming excessive power.

BACKGROUND OF THE INVENTION

The length of transistor gates of currently available CMOS integrated circuits is 0.8 $\mu$m. With reduction in size of CMOS integrated circuit devices, the length of transistor gates tends to be smaller, and presently CMOS integrated circuits having transistor gate lengths of 0.6 $\mu$m are in the development.

For a transistor having a transistor length of 0.8 $\mu$m, a transistor gate is operable with 5 volts power-supply voltage applied thereto, however, for a transistor having a transistor length of 0.6 $\mu$m, the power-supply voltage of such a transistor is expected to be reduced to a value between 2.7 V and 3.3 V for assuring pressure proof. As transistor gates become even smaller, for example if the gate lengths are to be in the range of 0.3 to 0.2 $\mu$m, the power-supply voltage applied to the transistor gates will be reduced even more.

If the transistor gate length is shortened to the range of 0.2 to 0.3 $\mu$m, the power-supply voltage is expected to be approximately 1.5 volts. Thus, when a very minute transistor gate having a gate length of 0.6 $\mu$m or less is to be manufactured, it is impossible to avoid an approximately 20% variation in actual gate length. This variation between the desired gate length and the actually manufactured transistor gate length is important. For example, if it is desired to make a gate with a gate length of 0.3 $\mu$m, and the actually manufactured transistor gate length is 0.25 $\mu$m or 0.35 $\mu$m, problems arise in that operating speed and value of the power-supply voltage of transistor gates are noticeably different than expected.

SUMMARY OF THE INVENTION

It is an object of the present invention to provide a CMOS integrated circuit device capable of determining a power-supply voltage optimal for a transistor gate and supplying the transistor gate with such an optimal voltage even if manufactured transistor gate lengths may have a variation (e.g., are smaller) from expected gate lengths.

The invention provides a CMOS integrated circuit including an oscillator including a capacitor having a polysilicon gate of one of several transistors as an electrode thereof, and a diffused resistor located adjacent to the polysilicon gate, a counter circuit for calculating a frequency of the oscillator, a power-supply voltage control circuit for selecting an optimal power-supply voltage for transistors in accordance with the frequency, and a power-supply circuit for generating the optimal power-supply voltage.

In a preferred embodiment, the power-supply voltage control circuit has an EEPROM and a keying circuit including switches controlled by the EEPROM in terms of opening and closing thereof.

In another preferred embodiment, the counter circuit includes a counter section connected to an output of the oscillator and an output of external clock, and being reset by an external clock signal, and a sample hold section for holding values calculated by the counter section before the reset. The sample hold section is connected to an input of the EEPROM and an output of the external clock.

In this invention, the gate lengths of transistors in the CMOS integrated circuit can be regarded as having no variation because they are made using a uniform process, and hence, it is possible to form on each wafer or in each integrated circuit an optimal power-supply voltage setting circuit comprising a CR oscillator, a counter circuit, a power-supply voltage control circuit and a power-supply circuit.

In this invention, the CR oscillator of the optimal power-supply voltage setting circuit is formed by a capacitor which uses a polysilicon gate and a silicon substrate of one of several transistors of the CMOS integrated circuit as electrodes, or a capacitor which uses a polysilicon gate of the transistors and a polysilicon gate beneath it, for example a control gate and a floating gate, as electrodes, and a diffused resistor, for example a diffused resistor of diffusion area of a source or a drain, and which is located adjacent to the polysilicon gates.

In this invention, after the CMOS integrated circuit has been formed, the optimal power-supply voltage for the transistor gates of the CMOS integrated circuit can be set by connecting test pins to the polysilicon gate of the optimal power-supply voltage setting circuit and to the diffused resistor, and by operating the CR oscillator, the counter circuit, the power-supply voltage control circuit and the power-supply circuit.

After the optimal power-supply voltage has been set, the CR oscillator and the counter circuit in the optimal power-supply voltage setting circuit are no longer necessary for normal circuit operation, and so after the optimal power-supply voltage has been determined by the power-supply control circuit, they can be separated from the CMOS integrated circuit. Here, the CR oscillator and the counter circuit of the optimal power-supply voltage setting circuit can be electrically cut off from the rest of the integrated circuit and so they do not necessarily need to be separated.

The CMOS integrated circuit of the present invention uses the counter circuit to calculate the frequency of the oscillator formed using a capacitor which uses a polysilicon gate of one of several transistors as an electrode, and a diffused resistor located adjacent to this polysilicon gate, and based on this calculated data, the power-supply voltage which is optimal for the gate length of the polysilicon gate of the transistor, and so it is possible to supply the optimal power-supply voltage to the polysilicon gates of the transistors.

The integrated circuit of the invention uses the counter circuit to check the frequency of the oscillator formed using a capacitor which uses the polysilicon gate of one of the transistors as an electrode and the diffused resistor of that transistor, and based on the checked data, the power-supply control circuit sets the optimal power-supply voltage for the transistor, and so when compared to prior CMOS integrated circuits, it is possible to select a suitable power-supply voltage that corresponds to the lengths of the transistor gates of the CMOS integrated circuit.

Also, according to the invention, as the CMOS integrated circuit is made smaller, even though variations occur in transistor gate lengths of the CMOS integrated circuit during manufacturing, the optimal operation speed and power consumption of the transistor gates can be set easier than was done in prior devices.

The above and other objects and advantageous features of the present invention will be made apparent from the following description made with reference to the accompanying drawings.

BRIEF DESCRIPTION OF THE DRAWINGS

FIG. 1 is a block diagram giving a summary of an embodiment of the CMOS integrated circuit device of the present invention.

DESCRIPTION OF THE PREFERRED EMBODIMENTS

Figure 1A:
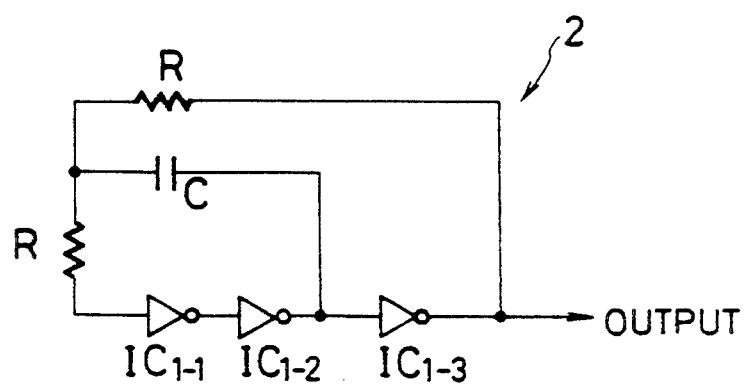
FIG. 1A is a schematic diagram illustrating a CR oscillator.

A preferred embodiment in accordance with the invention will be explained hereinbelow with reference to drawings.

In an embodiment in accordance with the invention illustrated in FIG. 1, an optimal power-supply voltage setting circuit 1 comprises a CR oscillator 2, a counter circuit 3, a power-supply voltage control circuit 4 and a power-supply circuit 5.

Figure 1B:
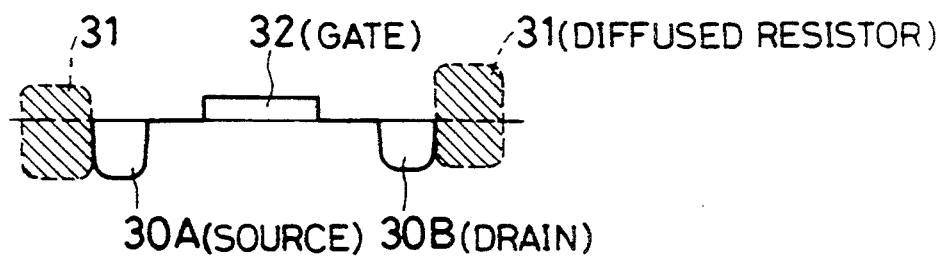
FIG. 1B is a schematic view illustrating the positional relationship among a gate, a source area, a drain area and diffused resistors.

In this embodiment, the CR oscillator 2 comprises a capacitor C having a control gate and a floating gate of a transistor as electrodes, and a diffused resistor of a source area or a drain area each located adjacent to the gates. More specifically, the capacitor C comprises polysilicon of the control gate of $IC_1$ and polysilicon of the floating gate of EEPROM. For instance, as shown in FIG. 1A, one electrode of the CR oscillator 2 comprises the control gate, and the other electrode comprises the floating gate of EEPROM. As shown in FIG. 1B, the diffused resistors 31 are positioned adjacent to the source and drain areas 30A, 30B located in the vicinity of the gate 32. The frequency of the CR oscillator 2 is determined by the capacitance C of the capacitor and the resistance R of the diffused resistor of the source or drain adjacent to the gate. The counter circuit 3 electrically connected to the CR oscillator 2 calculates the frequency of the CR oscillator 2, and receives external clock signals, which act as timing references, from an external clock signal input terminal 6 for operating the counter circuit 3. Connected to the counter circuit 3 is the power-supply voltage control circuit 4 for selecting an optimal power-supply voltage to be applied to the polysilicon gates based on the frequency calculated by the counter circuit 3. The power-supply circuit 5 is connected to the power-supply voltage control circuit 4. This power-supply circuit 5 can generate the optimal voltage selected by the power-supply voltage control circuit 4 from high voltage supplied from an external power-supply input terminal 7.

In this embodiment, the optimal power-supply voltage setting circuit 1 is patterned on an IC chip, as explained later with reference to FIG. 4. During manufacturing an IC chip, when several identical IC patterns are formed on a common silicon wafer, the optimal power-supply voltage setting circuit 1 is formed for each IC pattern together with the main electronic circuit patterns.

Figure 4:
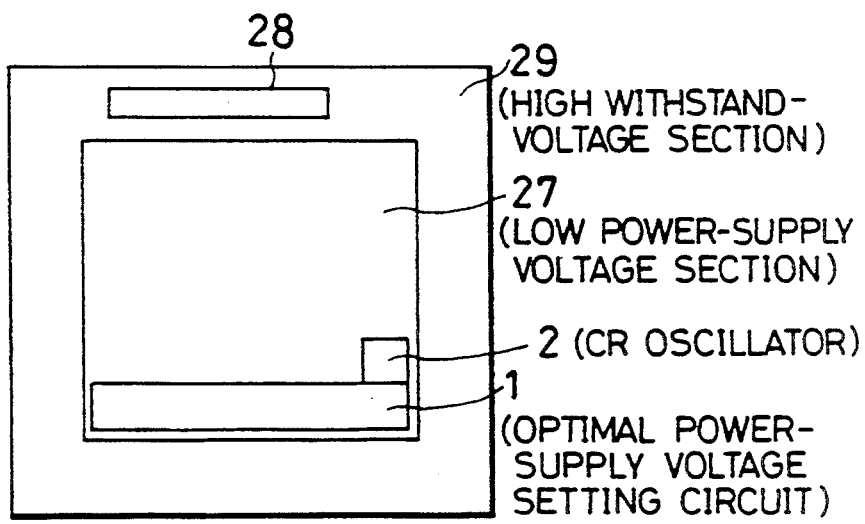
FIG. 4 is a diagram showing the chip arrangement for an embodiment of the CMOS integrated circuit device of the invention.

For example, as shown in FIG. 4, the optimal power-supply voltage setting circuit 1 is arranged on an IC chip so that the polysilicon gates of the CR oscillator 2 is located in a low power-supply voltage section 27 and all the other circuit 28 are located in a surrounding high withstand-voltage section 29. Thus, again, the CR oscillator 2 is positioned in the low power-supply voltage section 27, and all the other circuits 28 including the counter circuit 3, the power-supply voltage control circuit 4 and the power-supply circuit 5, are positioned in the high withstand-voltage section 29.

Thus formed circuit can be used as the power-supply voltage control circuit 4 for transistors with very thin gates, or it can be used as a test circuit for the specified settings.

In the integrated circuit of this embodiment, the transistors have gate lengths of 0.3 μm, and the gates with low sheet resistance are made of heavy metal, polysilicon and the like. The frequency of a CR oscillator, formed by a capacitor having polysilicon gates as electrodes thereof and a diffused resistor of diffusion area adjacent to polysilicon gates, is determined by the capacitance C of the capacitor and the resistance R of the diffused resistor, and accordingly if a frequency $f_0$ of a CR oscillator is detected, a gate length can be calculated.

In this embodiment constructed as explained above, after the IC patterns have been formed, the operation of each of the IC patterns on a silicon wafer can be checked by connecting test pins to electrodes of the IC patterns. During this check, the optimal power-supply voltage setting circuit 1 comprising the CR oscillator 2, the counter circuit 3, the power-supply voltage control circuit 4 and the power-supply circuit 5 is operated to determine optimal power-supply voltages for the transistors. After such voltages have been determined, the CR oscillator 2 and the counter circuit 3 in the optimal power-supply voltage setting circuit 1 are no longer necessary for normal operation of the circuit and hence they are electrically separated off the other electronic circuits in the IC pattern.

Figure 2:
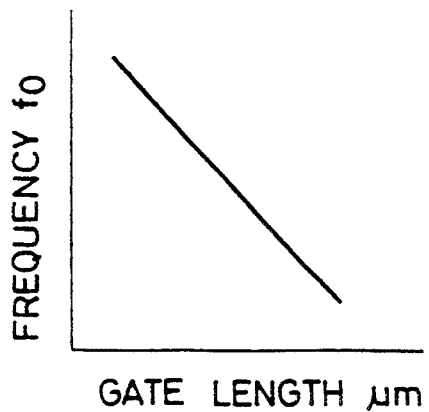
FIG. 2 is a diagram showing the characteristics of the frequency and the relationship between the gate lengths of the polysilicon gates of the CMOS integrated circuit device and the frequency of the gates.

In this embodiment, the inspection of the gate lengths of the polysilicon gates of the manufactured wafers is done as follows. First, an output of the CR oscillator 2 is connected to an input of the counter circuit 3 and an external clock is input to the counter circuit 3 from the external clock signal input test terminal 6 to reset the counter circuit 3. Then, the calculation for the frequency of the CR oscillator 2 starts. As shown in the characteristic curve of the CR oscillator frequency and gate lengths illustrated in FIG. 2, the frequency $f_0$ of the CR oscillator 2 has nearly linear relationship with the transistor gate length. Thus, the larger the gate length becomes, the lower the frequency $f_0$ of the CR oscillator 2 becomes, and the smaller the gate length becomes, the higher the frequency $f_0$ of the CR oscillator 2 becomes. Accordingly, it is possible to calculate the capacitance of the capacitor and the gate length from the oscillator frequency $f_0$ calculated by the counter circuit 3.

Figure 3:
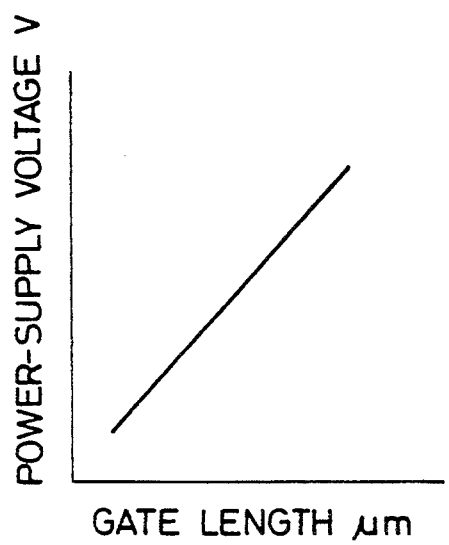
FIG. 3 is a diagram showing the characteristics of the power-supply voltage and the relationship between the gate lengths of the polysilicon gates of the CMOS integrated circuit and the power-supply voltage.

In addition, as shown in the characteristic curve of the gate length and the optimal power-supply voltage in FIG. 3, the relationship between the gate length and the optimal power-supply voltage can be regarded as being nearly linear, accordingly, according to the relationship between the gate length and the optimal power-supply voltage, the smaller the gate length becomes, the lower the power-supply voltage applied to the gate becomes, and similarly the larger the gate length becomes, the higher the power-supply voltage applied to the gate becomes.

Based on the gate length calculated from the frequency $f_0$ of the CR oscillator 2, the optimal power-supply voltage is calculated and then sent to the power-supply control circuit 4. The power-supply control circuit 4 controls the power-supply circuit 5 based on the optimal value for the power-supply voltage. The power-supply circuit 5 controls the high withstand voltage section of the external power-supply input terminal 7 to produce the low optimal power-supply voltage indicated by the power-supply voltage control circuit 4, and outputs thus produced voltage through a low-voltage output pin 8.

In this embodiment, when the value of the frequency $f_0$ of the CR oscillator 2 is high, it indicates that the gate lengths of the transistor gates of the manufactured integrated circuit are small, and hence the power-supply voltage applied to the transistor gates of this integrated circuit is low, matching the gate lengths. On the other hand, if the value of the frequency $f_0$ of the CR oscillator 2 is low, it indicates that the gate lengths of the transistor gates of the manufactured integrated circuit are large, and so the power-supply voltage applied to the transistor gates of the integrated circuit is high, matching the gate lengths.

Figure 5:
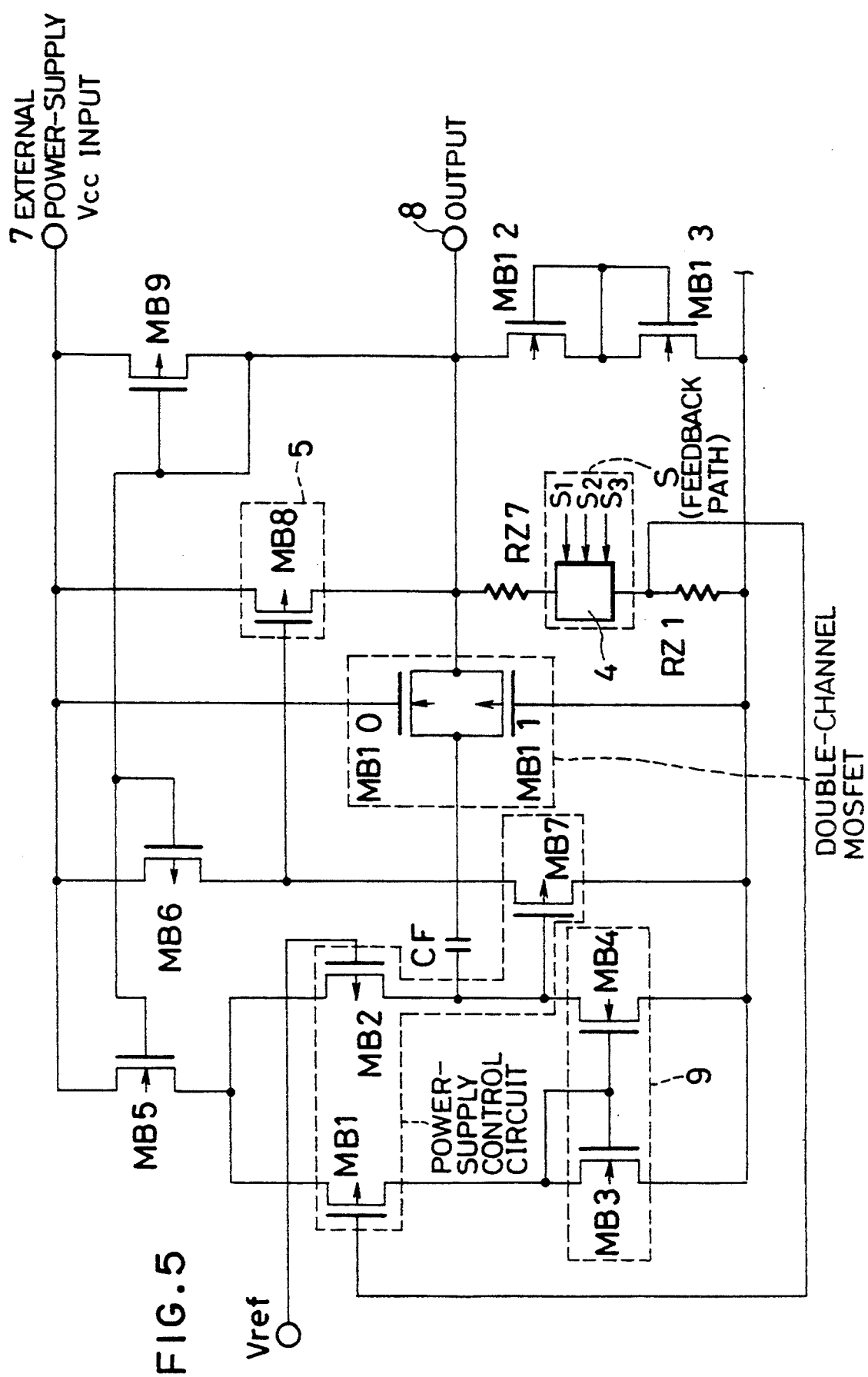
FIG. 5 is a circuit diagram of the power-supply voltage control circuit and power-supply circuit of the embodiment in accordance with the invention shown in FIG. 1.

FIG. 5 shows the power-supply voltage control circuit 4 and the power-supply circuit 5 used in this embodiment. In FIG. 5, transistors MB1 through MB13 are all MOSFET transistors, and among them, transistors MB3, MB4, MB5, MB12 and MB13 are N-channel MOSFET transistors, transistors MB1, MB2, MB6, MB7, MB8 and MB9 are P-channel MOSFET transistors, and transistors MB10 and MB11 are double-channel (PN-channel) MOSFET transistors. CF is a polarized electrolytic capacitor. Transistors MB1 through MB4 form a differential amplifier, and transistors MB3 and MB4 form a current-mirror circuit 9.

The gate of the transistor MB1 is connected to the power-supply voltage control circuit 4. The reference voltage Vref is supplied to the gate of the transistor MB2. The reference voltage has been divided from an external voltage Vcc and is about half the voltage of Vcc.

The transistors MB5, MB6 and MB9 form a constant-current circuit. The current which flows through MB5 and MB6 is kept to be constant because a fixed current is supplied thereto from the transistor MB9 connecting the gate directly to the source. Thus, a constant current can be supplied from the transistor MB5 to the differential amplifier.

The output of the differential amplifier is supplied to the transistor MB8 by way of the transistor MB7, and the source of the transistor MB8 is connected to the differential amplifier through the electrolytic capacitor CF and the resistors of the double-channel transistors MB10 and MB11. The capacitor CF and the resistors of the double-channel transistors MB10 and MB11 form a feedback circuit for stabilizing the differential amplifier. A feedback path S (see FIG. 5) is a circuit for varying a division ratio of a feedback voltage for controlling the power-supply voltage control circuit 4. The resistor values of the feedback path S may be varied so that the gate voltage MGMB1 of MB1 is varied to thereby control the output.

Figure 6:
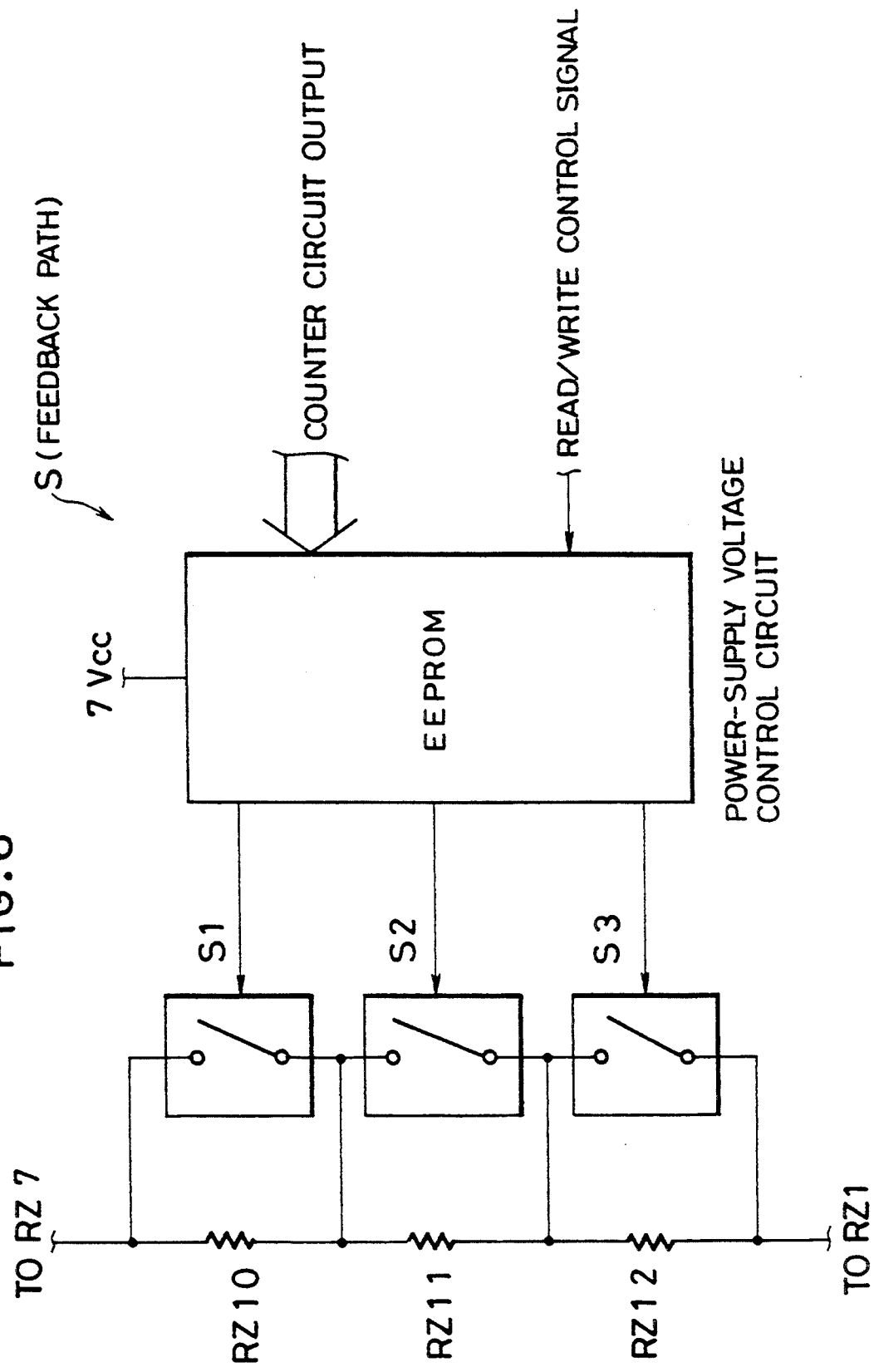
FIG. 6 is a circuit diagram of the power-supply voltage control circuit shown in FIG. 5.

The power-supply voltage control circuit 4 used in this embodiment is shown in detail in FIG. 6. FIG. 6 is a circuit diagram of the feedback path S shown in FIG. 5. In FIG. 6, resistors RZ1 and RZ7, resistors RZ10 through RZ12 of the power-supply voltage control circuit 4, and the feedback path S are used to change the power-supply voltage, and the voltage divided by RZ1 is fed back to the transistor MB1 of the differential amplifier. The output is the power-supply voltage selected by the power-supply voltage control circuit 4. The transistors MB12 and MB13 are a kind of resistor circuits.

In the embodiment shown in FIG. 6, the power-supply voltage control circuit 4 comprises an EEPROM, switches S1, S2 and S3, and resistors RZ10, RZ11 and RZ12. EEPROM means an electrically erasable, programmable read only memory. In this embodiment, control signals to read/write to the EEPROM are given externally, however, these read/write control signals can be given externally or can be generated by an internal circuit. In this embodiment, the outputs of the counter circuit 3 are stored in the EEPROM. The EEPROM is connected to a power-supply voltage 7 Vcc, and receives power-supply from the voltage 7 Vcc.

Figure 6A:
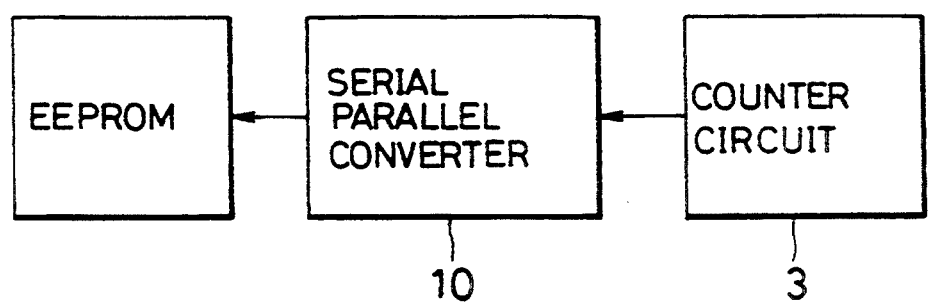
FIG. 6A is a block diagram showing how the counter circuit emits signals to EEPROM.

As shown in FIG. 6A, serial signals are emitted from the counter circuit 3 to a serial parallel converter 10 and converted into parallel signals in the converter 10. These converted signals designate addresses in the EEPROM.

With reference to FIG. 6, when the frequency $f_0$ of the CR oscillator 2 calculated by the counter circuit 3 and stored in the EEPROM is high, greater number of the switches are closed to make the voltage level of the output 8 small. On the other hand, if the frequency $f_0$ of the CR oscillator 2 is low, greater number of switches are open to make the voltage level of the output 8 large.

It should be noted that this embodiment uses three switches and resistors respectively, however, more or less switches and resistors may be used.

For gates having very small gate lengths near 0.3 μm and low sheet resistance, the gates are made of heavy metal or polysilicon and the like. The frequency of the CR oscillator formed by a capacitor using these polysilicon gates as electrodes thereof, and a diffused resistor, can be determined by the CR value, and hence if the frequency $f_0$ is obtained, the gate length can be calculated.

Figure 7:
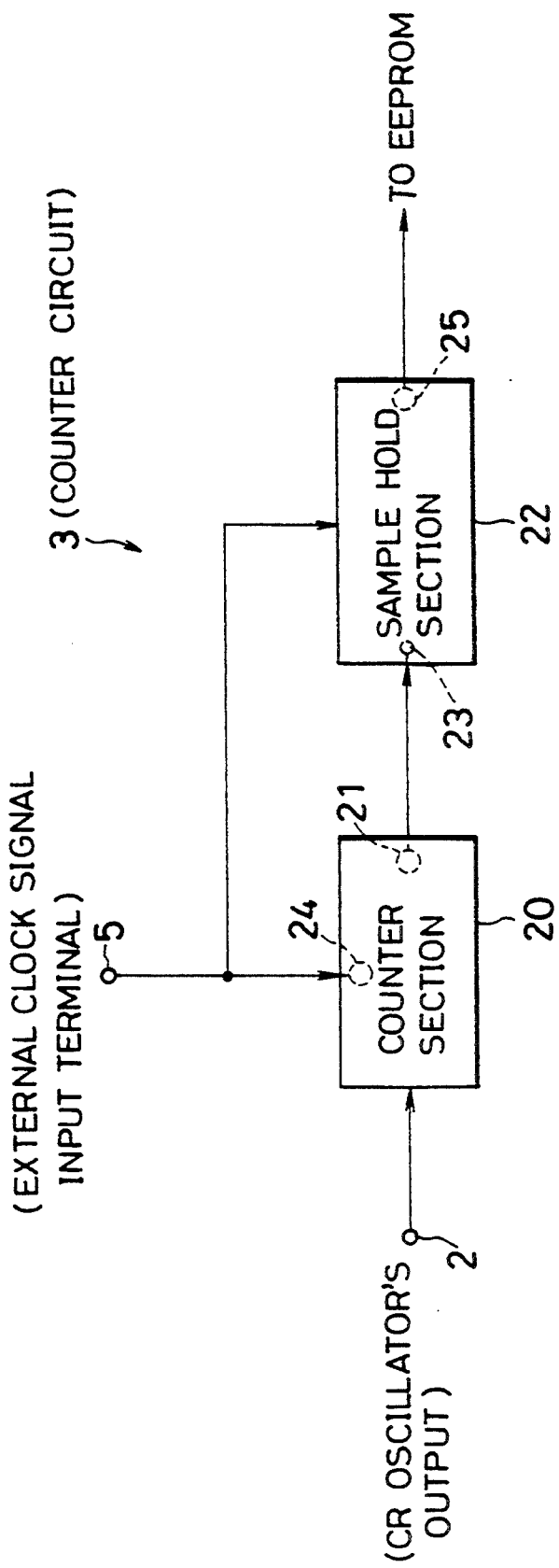
FIG. 7 is a block diagram showing the counter circuit of the embodiment shown in FIG. 1.

FIG. 7 shows the counter circuit 3 in detail. In FIG. 7, the counter circuit 3 contains a counter section 20 and a sample hold section 22. In this embodiment, a CL terminal of the counter section 20 is connected to an output of the CR oscillator 2, and an R terminal is connected to the external clock input terminal 5. An output terminal 21 of the counter section 20 is connected to an input terminal 23 of the sample hold section 22, and a second input terminal 24 of the counter section 20 is connected to the external clock input terminal 5. An output terminal 25 of the sample hold section 22 is connected to an input terminal of the EEPROM.

In operation of the counter circuit 3, when an external clock signal is input from the external clock input terminal 5, the counter section 20 is reset and simultaneously starts counting the frequency of the CR oscillator 2. When the counter section 20 receives a next external clock signal, the counter section 20 stops counting the frequency of the CR oscillator 2 and enters a reset condition again. Such operation of the counter section 20 is repeated every time an external clock signal is input thereto.

The sample hold section 22 holds a value (parallel data) calculated just before the counter section 20 is reset by the external clock signal. Accordingly, in this embodiment, a timing at which the counter section 20 is reset is arranged to be a little later than a timing at which the sample hold section 22 holds the calculated value.

The outputs of the sample hold section 22 are stored in the EEPROM shown in FIG. 6 during a write operation, and the write operation is performed when the CR oscillator 2 is in a stable condition.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A CMOS integrated circuit for generating voltage related to transistor gate length, comprising:
   an oscillator including a capacitor having a polysilicon gate of one of several transistors as an electrode thereof, and a diffused resistor located adjacent to said polysilicon gate;
   a counter circuit for calculating a frequency of said oscillator;
   a power-supply voltage control circuit for selecting an optimal power-supply voltage for transistors in accordance with said frequency; and
   a power-supply circuit for generating said optimal power-supply voltage.

2. A CMOS integrated circuit for generating voltage related to transistor gate length in accordance with claim 1, wherein said power-supply voltage control circuit comprises an EEPROM and a keying circuit including switches controlled by said EEPROM in terms of opening and closing thereof.

3. A CMOS integrated circuit for generating voltage related to transistor gate length in accordance with claim 1, wherein said counter circuit comprises:
   a counter section connected to an output of said oscillator and an output of an external clock, and being reset by an external clock signal, and
   a sample hold section for holding values calculated by said counter section before the reset, said sample hold section being connected to an input of said EEPROM and an output of said external clock.

* * * * *

UNITED STATES PATENT AND TRADEMARK OFFICE
CERTIFICATE OF CORRECTION

PATENT NO.   : 5,442,314
DATED        : August 15, 1995
INVENTOR(S)  : Takaaki HARA It is certified that error(s) appears in the above-identified patent and that said Letters Patent is hereby corrected as shown below:

Col. 1, line 15, delete "operation" and insert --operate--.

Signed and Sealed this

Twenty-third Day of January, 1996

Attest:

BRUCE LEHMAN

Attesting Officer    Commissioner of Patents and Trademarks